United States Patent [19]

Paterson

[11] Patent Number: 4,888,630
[45] Date of Patent: Dec. 19, 1989

[54] FLOATING-GATE TRANSISTOR WITH A NON-LINEAR INTERGATE DIELECTRIC

[75] Inventor: James L. Paterson, Richardson, Tex.

[73] Assignee: Texas Instruments Incorporated, Dallas, Tex.

[21] Appl. No.: 170,969

[22] Filed: Mar. 21, 1988

[51] Int. Cl.⁴ ...................... H01L 28/78; G11C 11/22
[52] U.S. Cl. ...................................... 357/23.5; 357/24; 365/117; 365/145; 365/228
[58] Field of Search .................. 357/23.5, 24; 365/117, 365/145, 228

[56] References Cited

U.S. PATENT DOCUMENTS 4,144,591  3/1979  Brody ................................. 357/23.5

FOREIGN PATENT DOCUMENTS 2542490   9/1984  France .................................. 365/185
0042381   4/1977  Japan ............................. 357/23 VT
0128873  10/1980  Japan ............................. 357/23 VT

OTHER PUBLICATIONS

Evans et al., "The Operation of a Non-Volatile Ferroelectric RAM," IEEE Non-Volatile Semiconductor Memory Workshop, Paper 1.5 (2/22/88).
Fisch, et al., "A Quantitative Approach Towards Measuring Thin Film Ferroelectric Reliability," IEEE Non-Volatile Semiconductor Memory Workshop, Paper 2.1 (2/22/88).
Eaton, "Non-Volatile Applications of Ferroelectric Technology", IEEE Non-Volatile Semiconductor Memory Workshop, Paper 1.7 (2/22/88).

*Primary Examiner*—Eugene R. LaRoche
*Assistant Examiner*—Michael B. Shingleton
*Attorney, Agent, or Firm*—Rodney M. Anderson; Melvin Sharp

[57] ABSTRACT

A non-volatile memory cell having a floating-gate transistor is disclosed, which has a ferroelectric material for the dielectric between the floating gate electrode and the control gate electrode. The ferroelectric material provides for non-linear capacitance characteristics with voltage, and is polarizable into two states by the application of voltage across the capacitor plates of sufficient magnitude. The memory cell is read by applying a voltage to the control gate electrode which will sufficiently be capacitively coupled to the floating gate electrode to turn on the transistor when the ferroelectric material is in the programmed state, but which will not be sufficiently coupled in the erased state to turn the transistor on. The ferroelectric material may be incorporated directly above the floating gate transistor electrode, or may be formed remotely from the transistor between two metal layers, the lower of which is connected to the floating gate electrode.

8 Claims, 4 Drawing Sheets

FLOATING-GATE TRANSISTOR WITH A NON-LINEAR INTERGATE DIELECTRIC

This application is in the field of integrated circuits, and is more specifically directed to non-volatile semiconductor memories.

BACKGROUND OF THE INVENTION

An important type of memory for computer systems is non-volatile memory, i.e., memory which retains its data without bias to the circuit. Semiconductor memories which provide non-volatile capability include fusable link programmable read only memories (commonly called PROMs), which distinguish between open and closed fuses to determine the data state. Other non-volatile semiconductor memories include ultra-violet erasable programmable read only memories (commonly called EPROMs), and electrically erasable programmable read only memories (commonly called EEPROMs and EAROMs). The EPROM and EEPROM devices utilize floating-gate MOS transistors in the storage cells, with hot electron injection or Fowler-Nordheim tunnel injection from the drain of the MOS transistor to the floating gate accomplishing the programming of a cell.

All of these devices, possibly with the exception of the EEPROMs, are classified as read-only memories, since the writing of data, or programming, is not easily accomplished with the memory installed in the system. In the case of a fusable link PROM, a programmed bit cannot be rewritten once programmed, while EPROMs require the exposure of the memory array to ultraviolet light for erasure of the programmed memory cells. Programmed cells of modern EEPROMs are electrically erasable by way of Fowler-Nordheim tunneling of electrons from the floating gate to the source of the transistor, requiring a tunnel oxide under a portion of the floating gate, such tunnel oxide being thinner than the gate oxide under the floating gate at the transistor channel. Such erasure requires the application of the erase voltage for a long period of time, relative to a read cycle time, limiting the use of the EEPROM as a read/write memory. In addition, programming of the PROM, EPROM and EEPROM devices, and also erasure for EEPROM devices, requires the application of relatively high voltages to the memory cells of the devices for long periods of time relative to a read cycle, making post-installation writing of data cumbersome. The high voltages further also stress the memory cell structures, limiting the number of erase and write cycles to the memories, and further limiting the applicability of these non-volatile memories as read/write memories.

As described in "A Ferroelectric Nonvolatile Memory", by Eaton et al., *Digest of Technical Papers,* 1988 *IEEE International Solid-State Circuits Conference* (IEEE, 1988), pp. 130–131, ferroelectric dielectric materials have recently been found which have certain applications for semiconductor non-volatile memories. Examples of such ferroelectric materials include modified lead titanates, such as lead zirconium titanate (PZT) as described in the Eaton et al. paper. Ferroelectric materials are polarizable by an applied electric field of sufficient strength, and have a hysteresis loop in the polarization versus electric field (P-E) characteristic. If used as the dielectric in a parallel plate capacitor, the ferroelectric material provides a capacitance which is non-linear relative to voltage, and which has a hysteresis loop in the charge-voltage characteristic due to the hysteresis in the P-E characteristic. The "ferroelectric" name for such materials arises not from the presence of iron in the material, but from the hysteretic charge-voltage characteristic, resembling the B-H characteristic for ferromagnetic material.

Referring to FIG. 1, a charge-voltage diagram is shown for a capacitor having a PZT dielectric. It should be noted that the voltage of the horizontal axis of FIG. 1 is the relative voltage between two plates of the capacitor. The vertical axis is the charge stored on the capacitor, with the origin of FIG. 1 is at the center of the diagram. Beginning with the initial condition for the capacitor of a negative polarity voltage across the capacitor plates, shown at voltage $V_{LO}$ on FIG. 1, the polarization charge stored by the capacitor is negative in polarity. At this point, the PZT material is polarized into a first state, and the charge-voltage characteristic follows the right-hand curve in FIG. 1 as the voltage increases from $V_{LO}$. The portion of the curve, from voltage limits A to B of FIG. 1, corresponds to a high dielectric constant capacitor, as the charge stored i proportional to the applied voltage in this region. Following the curve of FIG. 1 to the point at which the voltage across the capacitor plates reaches a high voltage, shown at voltage $V_{HI}$ on FIG. 1, a polarization charge of positive polarity is stored by the capacitor. The capacitor is polarized at this point into a second state. From this point, as the applied voltage decreases the charge-voltage characteristic follows the left-hand curve, again having an effective high dielectric constant for voltages between limits C and D of FIG. 1.

The high dielectric constant portion of the two curves for the two polarized states occur at different voltages from one another. For a voltage in the range of A to B of FIG. 1, a capacitor having this material for a dielectric will act as a good capacitor if in the first state (corresponding to the right-hand curve), but will act as a poor capacitor in the second state (corresponding to the left-hand curve). Similar behavior for the opposite states occurs for an applied voltage within the limits of C to D. Depending upon the characteristics of the capacitor, for some ferroelectric capacitors voltage limit A be at a lower voltage than voltage limit D, so that a range of applied voltages may exist where both states have a high dielectric constant. In addition, for some ferroelectric capacitors a built-in bias may be present so that the characteristic shown in FIG. 1 may not be symmetric relative to the zero volt condition. So long as the applied voltage across the plates within the range shown between points C and B of FIG. 1, the capacitor will remain in its previously programmed state. The above-referenced paper indicates that the switching voltage, i.e., the voltage range approximately between points D and A of FIG. 1, is on the order of 2 volts; the voltage required to polarize the capacitor is on the order of 6 to 7 volts in either polarity.

The polarization of the ferroelectric dielectric material establishes an electric field analogous to the storage of charge across the capacitor plates, even if no such charge is actually stored on the plates. As mentioned in the above-referenced paper, this behavior of the dielectric can be used as the capacitor in a single-transistor dynamic random access memory (DRAM) cell, or may be coupled to cross-coupled inverters in a static RAM cell. Non-volatility in either case results from either positively or negatively polarizing the plate by applying either a negative or positive voltage across the plates.

It is an object of this invention to provide a electrically programmable and electrically erasable floating-gate memory cell using a ferroelectric dielectric between the floating and control gates of the cell.

It is a further object of this invention to provide such a memory cell which utilizes standard MOS transistor construction under the floating gate.

It is a further object of this invention to provide such a memory cell which can utilize the same dielectric layer under the floating gate as used for MOS transistors in the same circuit.

It is a further object of this invention to provide such a memory cell which can be programmed and erased with voltages on the order of the power supply to the memory device.

Other objects and advantages will become apparent to those of ordinary skill in the art having reference to the instant specification in conjunction with the drawings.

SUMMARY OF THE INVENTION

The invention may be incorporated into a floating-gate MOS transistor for use in a non-volatile memory cell. The floating gate, source and drain of the transistor are formed in a similar fashion as a normal MOS transistor. A ferroelectric material is used as a dielectric between the floating gate and the control gate of the floating-gate transistor to provide for non-linear and hysteretic charge-voltage behavior. The polarized state of the ferroelectric material defines the data state of the memory cell. A pass gate may be provided in the memory cell for selection of the desired floating-gate transistor.

DETAILED DESCRIPTION OF THE PREFERRED EMBODIMENT

Figure 2:
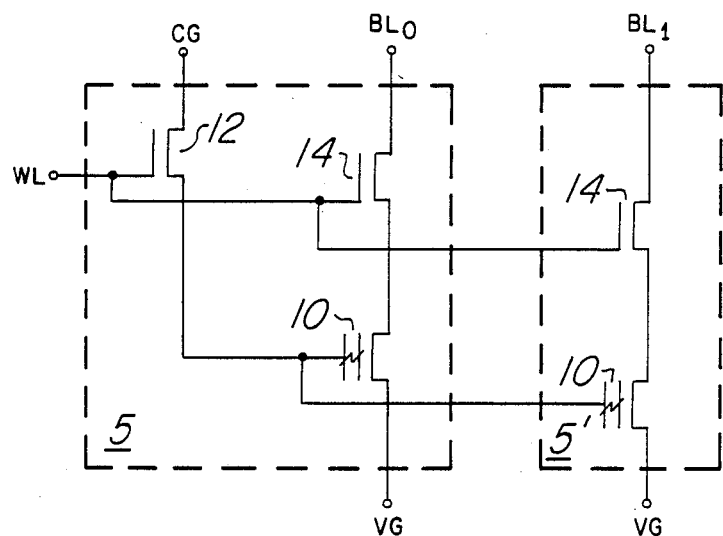
FIG. 2 is an electrical diagram, in schematic form, of a pair of EEPROM memory cells each incorporating a floating-gate transistor constructed according to the invention.

Referring now to FIG. 2, an EEPROM memory cell 5 incorporating a floating-gate transistor 10 constructed according to the invention is illustrated. It should be noted that the construction of cell 5 in FIG. 2 is similar to that used in conventional EEPROM memory cells where the floating-gate transistor uses Fowler-Nordheim tunneling for programming and erasure of the transistor state. Memory cell 5 includes floating-gate transistor 10 which has a ferroelectric dielectric between the floating gate and the control gate, as will be described above, and which has its source connected to virtual ground VG. Virtual ground VG presents a reference potential to memory cell 5, as is well known in the EPROM and EEPROM art. Control transistor 12 is an n-channel MOS transistor, which has its drain connected to a control gate signal CG, and which has its source connected to the gate of floating-gate transistor 10. The gate of control transistor 12 receives a word line signal WL at its gate which, as is known in the art, selects a row of the memory array in which memory cell 5 is included. Pass gate 14 is an n-channel transistor which has its source connected to the drain of floating-gate transistor 10 and which has its drain connected to bit line $BL_0$; the gate of pass gate 14 receives the word line signal WL.

It should be noted that pass gate 14 is not required if floating-gate transistor 10 does not have a depletion-mode state. In such a case, bit line $BL_0$ will be connected directly to the drain of floating-gate transistor, and control gate signal CG applied to the control gate of floating-gate transistor 10 will select floating-gate transistor 10; in the unselected state, with no voltage applied to the control gate, floating-gate transistor 10 will remain off.

Also shown in FIG. 2 is memory cell 5' in the same row of a memory array as memory cell 5. The configuration of FIG. 2 illustrates the configuration where an additional memory cell 5' which is to be selected by the same word line signal WL shares control transistor 12 with cell 5 in its row. Such sharing is accomplished by having the control gate of floating-gate transistor 10 in memory cell 5' connected to the source of control transistor 12 in memory cell 5, and the gate of pass gate 14 in memory cell 5' directly receiving the word line signal WL. The number of additional memory cells 5' which share control transistor 12 with memory cell 5 may be any number desired, so long as such additional memory cells are to be selected with the same word line signal WL, and so long as the load of such additional memory cells 5' are contemplated. Alternatively, of course, such additional memory cells 5' may each include their own control transistor 12 for receiving the control gate voltage CG and the word line signal WL similarly as memory cell 5.

Figure 3A:
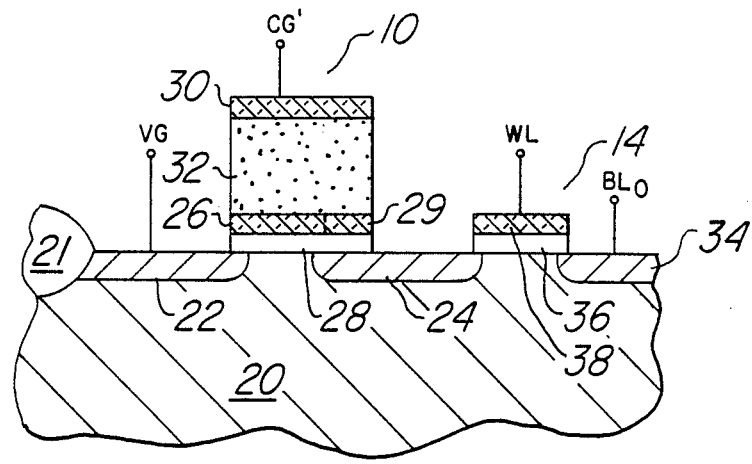
FIG. 3a is a cross-sectional diagram of the memory cell of FIG. 3 further including a program and erase electrode.
Figure 3:
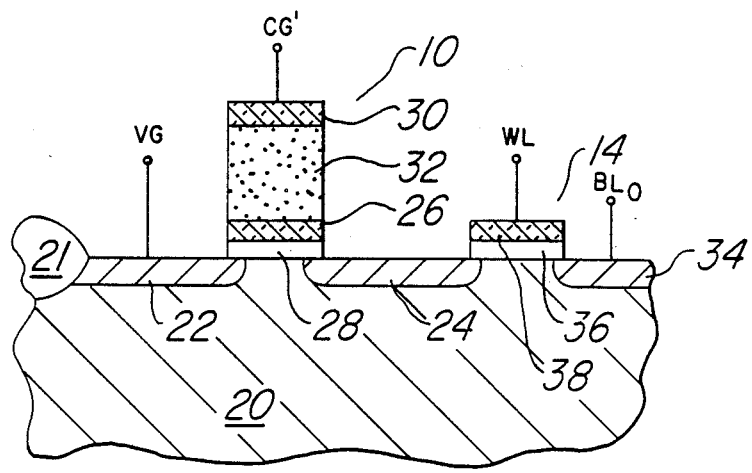
FIG. 3 is a cross-sectional diagram of a memory cell having a first embodiment of a floating-gate transistor constructed according to the invention.

As mentioned above, floating-gate transistor 10 in this embodiment of the invention has ferroelectric material such as lead zirconium titanate as the dielectric between its control gate and its floating gate. Referring now to FIG. 3, a cross-sectional diagram of floating-gate transistor 10 constructed according to the invention is illustrated in conjunction with a pass gate 14. Isolation oxide 21 is formed according to the well-known methods such as local oxidation (LOCOS) at selected locations of the surface of p-type substrate 20 to define the locations of substrate 20 at which transistors will be formed. Transistor 14 and floating-gate transistor 10 each have gate dielectric 36 and 28 respectively, formed of thermally grown silicon dioxide or such other gate dielectric as is well known in the art. According to the invention, the same layer may be used to form the gate dielectric 28 and 36 for both transistors 10 and 14 in an electrically erasable cell. Transistor 14 and floating-gate transistor 10 also have gate electrodes 38 and 26, respectively, overlaying the respective gate dielectric 36 and 28.

If desired, gate electrodes 26 and 38 may be formed from the same layer of any commonly used MOS transistor gate material such as polycrystalline silicon. Other materials may of course also be used for gate electrodes 26 and 38, such as a metal silicide compound formed with polycrystalline silicon (polycide), or a refractory metal such as tungsten or molybdenum. It may also be preferable in some cases to use separate materials for gate electrode 26 and 38, such as polycrystalline silicon for gate electrode 38 and a polycide or metal layer for gate electrode 38, depending upon the adhesion characteristics of the ferroelectric material to the material of floating gate electrode 26. N-type diffusions to form source region 22, region 24 and drain region 34 are made by way of ion implantation and subsequent diffusion in a self-aligned manner relative to gate electrodes 26 and 38. If desired, sidewall filaments (not shown) may be provided on the sides of gate electrodes 26 and 38, either prior to or after the implants to form diffusions 22, 24 and 34 depending upon the desired junction type, as is well known in the art.

Disposed above floating gate electrode 26 is ferroelectric intergate dielectric material 32. Ferroelectric material 32 may be deposited on gate electrode 26 either prior to or after the patterning and etching of gate electrode 26 (i.e., both ferroelectric material 32 and gate electrode 26 may be etched with the same pattern). Ferroelectric material 32, if a lead titanate such as PZT may be deposited by way of sputtering; other alternate ways such as spinning-on ferroelectric material 30 may also be used, as known in the art. The thickness of ferroelectric material 32 may be set as desired for the capacitor characteristics; thicknesses on the order of a 1 micrometer are known.

Control gate electrode 30 is disposed above ferroelectric material 32. Control gate electrode 30 may be fabricated from any one of a number of polycrystalline silicon, a refractory metal silicide compound with polycrystalline silicon ("polycide"), a refractory metal such as tungsten or molybdenum, or an aluminum or aluminum alloy metallization layer. Polycrystalline silicon is preferable as the material for control gate electrode due to its compatibility with subsequent processing and especially if the same polysilicon layer can be used for transistor gates and interconnections elsewhere in the integrated circuit. However, if the particular ferroelectric material 30 used is sensitive to high temperature processing after its deposition, the process temperature required for a reasonable deposition rate of polysilicon for control gate electrode 30 may damage ferroelectric material 32. In such case, the use of a refractory metal for control gate electrode 30 would be preferable.

Figure 4:
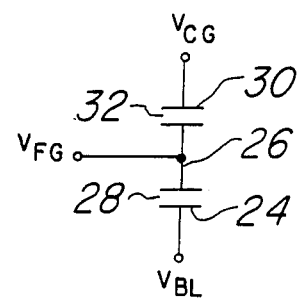
FIG. 4 is an electrical diagram, in schematic form, of the equivalent circuit of the floating-gate transistor of FIGS. 3 and 3a for purposes of programming and erasure.

Referring to FIG. 4 in conjunction with FIGS. 2 and 3, the operation of floating-gate transistor 10 in the programming, erase, and read operations will be described. For a given memory cell 5, selection is accomplished by the energizing of word line signal WL which is connected to the gates of pass transistor 14. Accordingly, the equivalent circuit of FIG. 4 assumes that pass transistor 14 is turned on to effectively connect bit line BL at diffusion 34 (of FIG. 3) to diffusion 24 at the drain of floating-gate transistor 10, and to connect the control gate signal CG to control gate electrode 30 of floating-gate transistor 10 (FIGS. 2 and 3 show a control gate signal CG' connected to control gate electrode 30, control gate signal CG' being control gate signal CG passed through control transistor 12 by word line signal WL being high). It should be further noted that the voltage to which word line .WL is driven for selection will be a voltage which is at or above the voltage of either bit line BL or control gate signal CG so that the high voltages appearing at bit line BL or control gate signal CG will be substantially passed to the appropriate terminal of floating-gate transistor 10.

Figure 1:
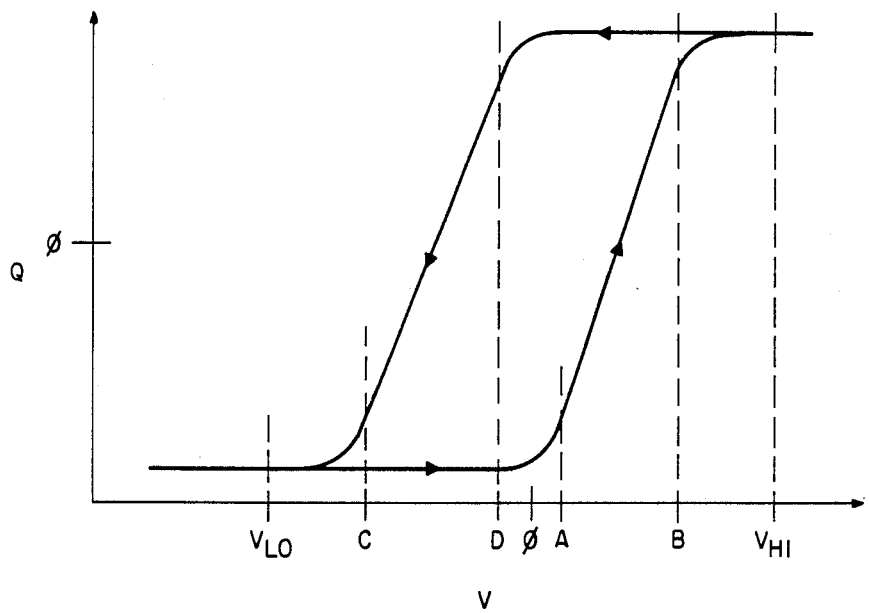
FIG. 1 is the charge-voltage characteristic for a capacitor having a ferroelectric dielectric.

As shown in FIG. 1, a voltage $V_{HI}$ across the plates of the ferroelectric capacitor polarizes the dielectric in a first direction, and a voltage $V_{LO}$ across the plates of the ferroelectric capacitor polarizes the dielectric in a second direction. The voltage $V_{LO}$ will be a voltage having a magnitude on the order of the voltage $V_{HI}$, but will be in the opposite polarity. For purposes of this description, the "programmed" state of floating-gate transistor 10 will be considered as the the state programmed by the application of $V_{LO}$ to the plates, and the "erased" state will be considered as the polarized state programmed by the application of $V_{HI}$.

The application of a programming or erase voltage to control gate electrode 30 is relatively straightforward, as the control gate signal CG is applied to control gate electrode 30 when word line signal WL turns on control transistor 12. The application of a voltage to floating gate electrode 26 is done by capacitive coupling between diffusion 24 and floating gate electrode 26. Accordingly, the voltage of bit line BL at diffusion 34 appears at diffusion 24 when pass gate 14 is turned on by word line signal WL. The voltage of diffusion 24 capacitively couples to floating gate 26 by the gate-to-drain overlap capacitance therebetween, with gate dielectric 28 as the capacitor dielectric.

An alternative way of ensuring sufficient capacitive coupling between drain 24 and floating gate 26 is to provide a portion of diffusion 24 over which floating gate electrode 26 overlaps, i.e., a program/erase electrode as is well known in the art. FIG. 3a illustrates the provision of program/erase electrode 29, which is an extension of floating gate electrode 26 at a location overlapping diffusion 24, separated therefrom by gate dielectric 28. The provision of program/erase electrode 29 increases the capacitive coupling between bit line BL and floating gate electrode 26, at a cost of increased cell area, and also increased processing complexity of the memory incorporating such a cell, as diffusion 24 cannot be fully made in a self-aligned fashion relative to program/erase electrode 29 as in the case of FIG. 3. As shown in FIG. 3a, provision of program/erase electrode 29 allows control gate electrode 30 and ferroelectric material 32 to also extend over diffusion 24, increasing the potential capacitive coupling from control gate electrode 30 to floating gate electrode 26 by also coupling to program/erase electrode 26.

A truth table for programming and erasing the ferroelectric floating-gate transistor 10 is as follows:

| voltage | erase | program |
| --- | --- | --- |
| $V_{CG}$ | $V_{PP}$ | 0 v |

| voltage | erase | program |
|---|---|---|
| $V_{BL'}$ | 0 v | $V_{PP}$ |
| WL | $V_{PP}$ | $V_{PP}$ |

In the above table, the voltages $V_{CG'}$ and $V_{BL'}$ are the voltages applied to control gate 3 and diffusion 24 with control transistor 12 and pass gate 14, respectively, turned on by the word line signal WL. The voltage $V_{PP}$ is a voltage which is approximately equal to both $V_{HI}$ and $V_{LO}$, so that its application is sufficient in either polarity to polarize ferroelectric dielectric 32. Accordingly, after application of the erase condition shown above, the ferroelectric material 32 is polarized so as to behave along the left-hand curve of FIG. 1, and after the application of the program condition shown above, the ferroelectric material 32 is polarized so as to behave along the right-hand curve of FIG. 1.

The operation of floating-gate transistor 10 for purposes of the read operation will now be explained. Referring to FIG. 4, the voltages $V_{CG'}$, $V_{FG}$ and $V_{BL'}$ may be expressed, in the steady state, relative to one another as follows:

$$V_{FG} - V_{BL'} = (V_{CG'} - V_{BL'}) * (C_{32}/(C_{32} + C_{28})) \qquad (1)$$

where $C_{32}$ is the capacitance value for the ferroelectric capacitor made up of floating gate 26, ferroelectric material 32 and control gate electrode 30, and where $C_{28}$ is the value of the capacitance of the capacitor made up of floating gate electrode 26, gate dielectric 28 and drain diffusion 24. It should be noted that in a conventional EPROM or EEPROM, the voltage $V_{PP}$ has a high enough magnitude so that hot electron injection from drain diffusion 24 to floating gate electrode 26 occurs, so that floating gate 26 is provided with a net charge after programming. This net charge provides for an added voltage (net charge divided by the total capacitance) to $V_{FG}$ to that expressed in equation (1) above; the presence or absence of such net charge (and its associated voltage on the floating gate) provides for the distinction between the programmed and erased states for a conventional EPROM or EEPROM. However, since the programming mode of ferroelectric floating-gate transistor 10 is the polarization of the ferroelectric material 32, $V_{PP}$ can be kept below the magnitude at which hot electron injection from drain diffusion 24 to floating gate electrode 26 occurs. Accordingly, in floating-gate transistor 10 according to the invention, there is no net charge on floating gate electrode 26, so that the above expression of the capacitive coupling of voltage $V_{CG'}$ to floating gate electrode 26 fully expresses the voltage $V_{FG}$ relative to $V_{BL'}$.

In the read operation of a conventional EPROM or EEPROM memory cell, as well as in the read operation of the memory cell described herein, since a virtual ground is applied to source diffusion 22 of floating-gate transistor 10, $V_{BL'}$ can be considered to be at zero volts. Equation (1) can be simplified to the following:

$$V_{FG} = V_{CG'} * (C_{32}/(C_{32} + C_{28})) \qquad (2)$$

As has been described above, the value of $C_{32}$ is programmable due to the action of ferroelectric material 32 as the dielectric thereof. Using memory cell 5 constructed according to the invention, the reading of the polarized state of ferroelectric material 32 can be done by detecting whether or not floating-gate transistor 10 turns on for a voltage applied to control gate electrode 30. If $V_t$ is the threshold voltage of floating-gate transistor 10 defined in terms of the voltage on floating gate electrode 26, the threshold voltage of floating-gate transistor 10 in terms of the voltage of control gate electrode 30, using equation (2) above, can be expressed as follows:

$$V_{tCG} = V_t * (C_{32} + C_{28})/C_{32}) \qquad (3)$$

It is apparent from this relationship that the threshold voltage of floating-gate transistor 10 will increase as the value $C_{32}$ (the capacitance of the control gate-ferroelectric-floating gate capacitor) decreases, and that the threshold voltage of floating-gate transistor 10 will decrease as the value $C_{32}$ increases. Referring back to FIG. 1, if the voltage applied to control gate electrode is between limits A and B, the programmed state (corresponding to the right-hand curve) of ferroelectric material 32 will have a high dielectric constant, and provide a high capacitance value $C_{32}$. In the erased state, corresponding to the left-hand curve of FIG. 1, ferroelectric material 32 will have a low effective dielectric constant, and provide a low capacitance value $C_{32}$. The voltage of control gate electrode 30 can thus be set to a voltage level for read operations, such a level being above the $V_{tCG}$ for ferroelectric material 32 in the programmed state, and below the $V_{tCG}$ for ferroelectric material 32 in the erased state. The read voltage for control gate electrode 30 must, of course, be sufficiently low (for example, below limit B of FIG. 1), so that ferroelectric material 32 is not polarized during a read.

With control gate electrode 30 at the read level, and with word line signal WL turning on control transistor 12 and pass gate 14, the state of memory cell 5 can be read in the usual EPROM/EEPROM manner, with the application of virtual ground VG to the source of floating-gate transistor 10, and the sourcing of current onto bit line BL to determine if floating-gate transistor 10 is in the on or off state, corresponding to the programmed and erased states of ferroelectric material 32.

It should be noted that so long as $V_t$ is greater than zero, $V_{tCG}$ for ferroelectric material 32 in the programmed state will also be greater than zero, i.e., floating-gate transistor 10 will be an enhancement-mode transistor for either state. In this condition, when the control gate voltage $V_{CG}$ is zero, in the unselected condition, floating-gate transistor 10 will remain off regardless of the state of ferroelectric material 32. Pass gate 14 thus is not necessary to de-select memory cell 5, and diffusion 24 can be directly connected to bit line BL. The voltage $V_{CG}$, when placed between limits A and B, will select the desired row of memory cells 5.

Figure 5:
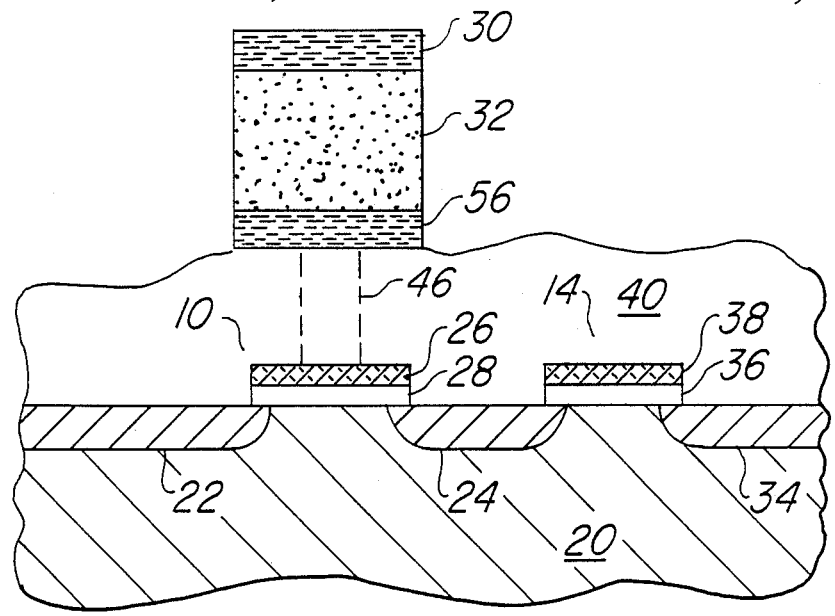
FIG. 5 is a cross-sectional diagram of a second embodiment of a floating-gate transistor constructed according to the invention.
Figure 6:
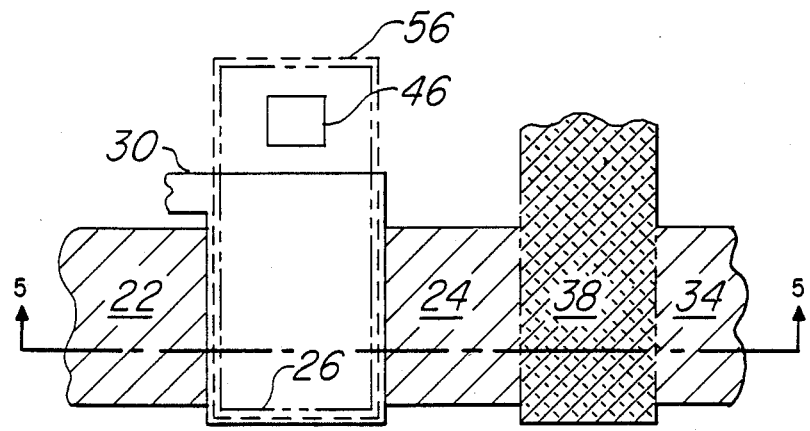
FIG. 6 is a plan view of the floating-gate transistor of FIG. 5.

Referring now to FIGS. 5 and 6, an alternate embodiment of memory cell 5 is shown. Similar reference numerals will be used for elements similar to those shown in the prior embodiment described relative to FIGS. 2 and 3. This alternate embodiment is especially useful if metal capacitor plates are required for proper adhesion to ferroelectric material 32, or if ferroelectric material 32 is temperature-sensitive to the extent that conventional wafer fabrication processes require construction limiting the temperatures to which the ferroelectric material 32 can be exposed.

In this embodiment, n-type diffusions 22, 24, and 34 are formed in self-aligned fashion relative to gate electrodes 26 and 38, as described above. Gate electrodes in this embodiment are preferable polycrystalline silicon, although any well-known gate electrode material may be used. Multilevel dielectric 40 covers the gate electrodes 26 and 38 in a conventional manner for single-level polysilicon processing; multilevel dielectric 40 may be conventional material, such as CVD silicon dioxide.

A contact via 46 is etched through multilevel dielectric 40 at a location over floating gate electrode 26, and first level metallization 56 is deposited after the via 46 is etched to make contact to floating gate electrode 26. First level metallization 56 is a conventional metallization layer such as aluminum or an aluminum-alloy such as copper-doped or silicon-doped aluminum; alternatively, first level metallization 56 may also be a refractory metal such as tungsten or Ti-W, or a combination of a refractory metal or metal alloy with an aluminum metal layer, as is well known in the art. Ferroelectric material 32 is disposed above first level metal 56, in a similar manner as in the embodiment of FIG. 3, and a second level metallization layer, forming control gate electrode 30, is formed above ferroelectric material 32.

As is evident from this construction, the floating gate of floating-gate transistor 10 is in two portions, one portion being first level metal 56 which serves as the bottom plate of the ferroelectric capacitor, and the second portion being polysilicon floating gate electrode 26 which controls the conduction in floating-gate transistor 110. The operation of floating-gate transistor 10 of this embodiment is substantially similar to that of the prior embodiment of FIGS. 2 and 3. The control gate electrode voltage $V_{CG}$ is coupled to first level metal 56 dependent upon the capacitance characteristic of the polarized state of ferroelectric material 32, and the coupled voltage is, of course, directly applied to floating gate electrode 26 of transistor 10 in the same manner as before.

Figure 7:
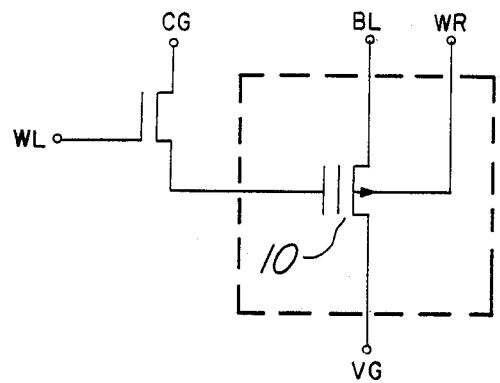
FIG. 7 is an electrical diagram, in schematic form, of a memory cell incorporating a floating-gate transistor constructed according to a third embodiment of the invention.
Figure 8:
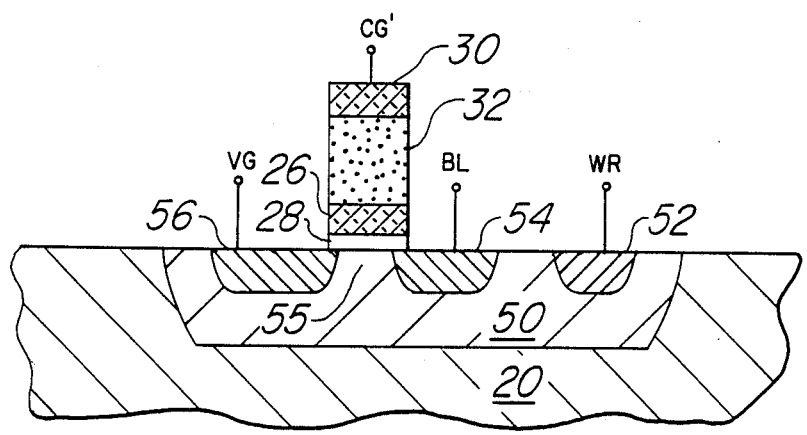
FIG. 8 is a cross-sectional diagram, in schematic form, of the memory cell of FIG. 7.

Referring now to FIGS. 7 and 8, a third embodiment of the floating-gate transistor 10 in a memory cell 5 is illustrated schematically and in cross-section, respectively. Floating-gate transistor 10 is, in this embodiment, a p-channel floating gate transistor, with its source connected to virtual ground VG, and its drain connected to bit line BL. The body node of floating-gate transistor 10 is connected to a write line WL, as will be explained below. The control gate of floating-gate transistor 10 is connected through control transistor 12 to control gate signal line CG; the gate of control transistor 12 receives the word line signal WL.

Referring to FIG. 8, a cross-section of floating-gate transistor 10 constructed according to the third embodiment of the invention is shown. Floating-gate transistor 10 is formed into an n-well 50 formed into p-type substrate 20. Gate dielectric 28 and floating gate electrode 26 are formed as described above relative to FIG. 3, and source region 56 and drain regions 54 are p-type diffusions formed into n-well 50 in self-aligned fashion relative to floating gate electrode 26. As described above, source region 56 is connected to virtual ground VG and drain region 54 is connected to bit line BL. Ferroelectric material 32 and control gate 30 are formed overlying floating gate electrode 26, as described above relative to FIG. 3.

Further included in this embodiment is body contact 52, which is an n-type diffusion formed into n-well 50, to which write line WR is connected. In this way, write line WR can control the bias of the channel region 55 lying under floating gate electrode 26, providing good coupling to floating gate electrode 26 for purposes of programming and erasing the state of ferroelectric material 32.

Since floating gate transistor 10 according to this invention is a p-channel device, the relationship of the voltages applied thereto for controlling the source-drain conduction are complementary to those discussed above. Consistent with the above embodiments, the programmed state will be considered to be the state where transistor 10 conducts when read, and the erased state will be the state where transistor 10 does not conduct when read. The following table describes the applied voltages for purposes of program and erase (note that the voltages are of opposite polarity relative to the above-described embodiments):

| voltage | program | erase |
|---|---|---|
| $V_{CG}$ | $V_{PP}$ | 0 v |
| $V_{WR}$ | 0 v | $V_{PP}$ |
| $V_{BL}$ | 0 v | don't care |
| $V_{VG}$ | 0 v | don't care |

It should be noted that the biasing of $V_{BL}$ and $V_{VG}$ to zero volts for the program operation is to prevent the forward biasing of the p-n junctions between source and drain diffusions 56 and 54, respectively, and write line WR. The don't care conditions for $V_{BL}$ and $V_{VG}$ in the erase operation illustrate that the programming operation is substantially performed by the body node contact 52 to channel region 55; of course, biasing of $V_{BL}$ and $V_{VG}$ to $V_{pp}$ would assist the erasure of the transistor 10 by additional capacitive coupling from drain and source to floating gate electrode 26.

For purposes of the read operation, the threshold voltage equations described above must be rewritten to account for p-channel transistor 10. The voltage appearing at floating gate electrode 26, according to equation (1) described above, is:

$$V_{FG} - V_{55} = (V_{CG} - V_{55} * (C_{32}/(C_{32}+C_{28}))) \quad (4)$$

where $V_{55}$ is the voltage of channel region 55 as biased from write line WR. Virtual ground line VG, in the p-channel embodiment, is biased to a positive voltage $V_{cc}$; to prevent forward bias of the drain diffusion junction, $V_{55}$ is similarly at $V_{cc}$ by application of such bias to write line WR.

As in the above-described embodiments, the value of $C_{32}$ is programmable due to the action of ferroelectric material 32 as the dielectric thereof. The expression for the threshold voltage $V_{tCG}$ as seen from control gate 30 can be described similarly as in equation (3) above:

$$V_{tCG} = V_t * (C_{32}+C_{28})/C_{32} \quad (5)$$

Transistor 10 of this embodiment, however, turns on when the voltage at floating gate electrode 26 is less than the voltage of source region 56 by greater than the threshold voltage $V_t$. Similarly as in the above-described embodiments, the polarized states of ferroelectric material 32 provide for two threshold voltages $V_{tCG}$ as seen from control gate 30. Accordingly for a read operation, control gate 30 will be biased to a negative voltage between limits C and D of FIG. 1, relative to $V_{cc}$ (at which virtual ground line VG and channel region 55 are biased). When ferroelectric material 32 is programmed, which in this embodiment corresponds to the left-hand curve of FIG. 1, $V_{tCG}$ will have a relatively low magnitude, and the application of the read voltage between limits C and D of FIG. 1 will cause transistor 10 to turn on. Conversely, when ferroelectric material 32 is erased (corresponding to the right-hand curve of FIG. 1), ferroelectric material 32 is a poor capacitor and the $V_{tCG}$ is relatively high. Transistor 10 is not on in the erased condition.

Figure 9:
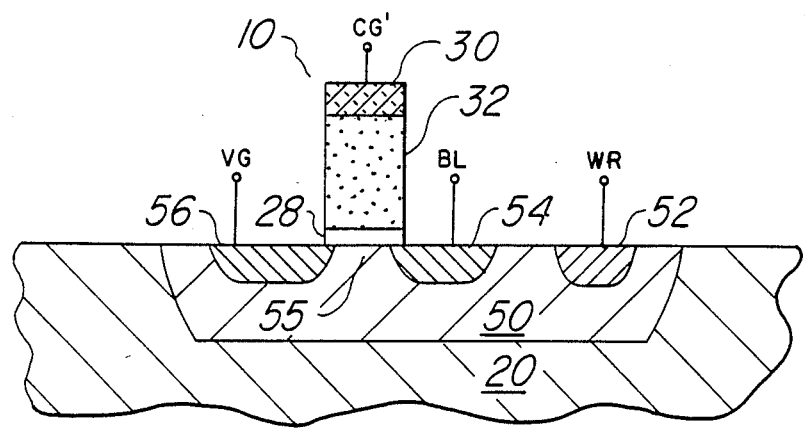
FIG. 9 is a cross-sectional diagram, in schematic form, of a memory cell incorporating a transistor constructed according to a fourth embodiment of the invention.

Referring to FIG. 9, another embodiment of transistor 10 is illustrated. The construction of transistor 10 of FIG. 9 is similar to that of an MNOS floating gate transistor, as is known in the art. Transistor 10 of FIG. 9 is substantially similar to the embodiment of FIG. 8, and may be controlled by a control transistor 12 similarly as that shown in FIG. 7, except that ferroelectric material 32 is deposited directly on gate dielectric 28, without floating gate electrode 26 disposed therebetween. The mechanism of this embodiment of the invention is the same as those described hereinabove, with ferroelectric material 32 in the programmed state coupling the voltage applied to control gate electrode 30 to channel region 55 to turn the transistor on; conversely, in the erased state ferroelectric material 32 will not so couple the control gate signal CG', and channel region 55 will not be inverted. The programming, erasure, and reading of the memory cell including transistor 10 of FIG. 9 is equivalent to that of transistor 10 of FIG. 8.

The memory cells described herein thus provide an alternative structure for a non-volatile memory, without reliance on the programming and erasure mechanisms of hot electron injection and Fowler-Nordheim tunneling as in conventional non-volatile memories. The processing required for the fabrication of the transistors below the gate level is substantially simplified over EEPROM processing, as no tunnel oxide need be provided for erasure purposes. Furthermore, the invention described herein provides for the incorporation of the benefits of fast programming and reliable data retention provided by the ferroelectric dielectric technology into the EPROM and EEPROM organization and environment.

Although the invention has been described in detail herein with reference to its preferred embodiment, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

I claim:

1. A method of operating a non-volatile memory cell, said non-volatile memory cell having a ferroelectric material disposed over a channel region which is disposed between first and second diffused regions to form a transistor, and a control gate disposed over said ferromagnetic material, comprising the steps of:
    writing the memory cell to a first state by applying a write potential to said control gate having a first polarity relative to said first diffused region, so that the ferroelectric material polarizes into a state having a low value of capacitance per unit area, or to a second state by applying a write potential to said control gate having a second polarity relative to said first diffused region, said second polarity opposite to said first polarity, so that the ferroelectric material polarizes into a state having a high value of capacitance per unit area relative to said first state; and
    reading the memory cell by applying a read potential to said control gate, said read potential having a magnitude selected so that when said memory cell is in said first state said transistor does not substantially conduct between said first and second diffused regions, and so that when said memory cell is in said second state said transistor substantially conducts between said first and second diffused regions.

2. The method of claim 1, wherein said memory cell further comprises a floating gate disposed between said ferroelectric material and said channel region.

3. The method of claim 2, wherein the write potential in said first polarity is of a magnitude sufficiently low so that net charge is not transferred to the floating gate electrode.

4. The method of claim 2, wherein said diffused regions are n-type, and wherein said first polarity is positive relative to said first diffused region.

5. The method of claim 2, wherein said floating gate electrode overlies said first diffused region.

6. The method of claim 1, further comprising, in said writing and reading steps, connecting said first diffused region to a bit line through a pass transistor.

7. The method of claim 6, wherein said pass transistor has a gate controlled by a word line signal.

8. The method of claim 7, wherein said word line signal also connects a potential to the control gate of said memory cell.

* * * * *